(12) United States Patent
Bartley et al.

(10) Patent No.: US 10,481,496 B2
(45) Date of Patent: Nov. 19, 2019

(54) FORMING CONDUCTIVE VIAS USING A LIGHT GUIDE

(71) Applicant: International Business Machines Corporation, Armonk, NY (US)

(72) Inventors: Gerald Bartley, Rochester, MN (US); Matthew Doyle, Chatfield, MN (US); Darryl Becker, Rochester, MN (US); Mark Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 15/635,374

(22) Filed: Jun. 28, 2017

(65) Prior Publication Data

US 2019/0004428 A1 Jan. 3, 2019

(51) Int. Cl.
*G03F 7/20* (2006.01)
*G03F 1/38* (2012.01)
(Continued)

(52) U.S. Cl.
CPC .............. *G03F 7/20* (2013.01); *G03F 1/38* (2013.01); *G03F 7/038* (2013.01); *G03F 7/039* (2013.01); *G03F 7/16* (2013.01); *G03F 7/26* (2013.01); *G03F 7/405* (2013.01); *H05K 3/4038* (2013.01); *H05K 2203/0562* (2013.01)

(58) Field of Classification Search
CPC ....................................................... G03F 7/20
See application file for complete search history.

(56) References Cited

U.S. PATENT DOCUMENTS 4,883,571 A    11/1989  Kondo et al.
4,888,450 A *  12/1989  Lando .................. G03F 7/0035
                                                    174/256
(Continued)

FOREIGN PATENT DOCUMENTS

CN    105813404 A    7/2016
CN    105813404 B    7/2018
(Continued)

OTHER PUBLICATIONS

"Notification of Transmittal of the International Search Report and the Written Opinion of the International Searching Authority, or the Declaration", dated Oct. 12, 2018, 9 pages.
(Continued)

*Primary Examiner* — Kathleen Duda
(74) *Attorney, Agent, or Firm* — Jared C. Chaney

(57) ABSTRACT

The present invention provides a process and a structure of forming conductive vias using a light guide. In an exemplary embodiment, the process includes providing a via in a base material in a direction perpendicular to a plane of the base material, applying a photoresist layer to an interior surface of the via, inserting a light guide into the via, exposing, by the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

21 Claims, 11 Drawing Sheets

(51) Int. Cl.
  *G03F 7/038* (2006.01)
  *G03F 7/039* (2006.01)
  *G03F 7/16* (2006.01)
  *G03F 7/26* (2006.01)
  *G03F 7/40* (2006.01)
  *H05K 3/40* (2006.01)

(56) References Cited

U.S. PATENT DOCUMENTS

| | | |
|---|---|---|
| 5,082,755 A | 1/1992 | Liu |
| 5,147,760 A | 9/1992 | Hoshinoughi et al. |
| 5,246,813 A | 9/1993 | Hoshinouchi et al. |
| 6,312,876 B1 | 11/2001 | Huang et al. |
| 6,682,875 B2 | 1/2004 | Kriksunov et al. |
| 7,676,920 B2 | 3/2010 | Farkas et al. |
| 8,230,592 B2 | 7/2012 | Kuczynski et al. |
| 8,302,301 B2 | 11/2012 | Lau |
| 8,726,498 B2 | 5/2014 | Pai et al. |
| 2009/0295498 A1 | 12/2009 | Shan et al. |
| 2010/0323099 A1* | 12/2010 | Sparing .......... C23C 22/52 427/96.1 |
| 2011/0067235 A1 | 3/2011 | Pai et al. |
| 2016/0135288 A1 | 5/2016 | Brown et al. |

FOREIGN PATENT DOCUMENTS

| | | |
|---|---|---|
| JP | 56132326 A | 10/1981 |
| JP | 62054433 A | 3/1987 |
| JP | 2007101567 A | 4/2007 |
| KR | 1020050038427 A | 4/2005 |
| KR | 1020060096199 A | 9/2006 |
| TW | 200632463 A | 9/2006 |

OTHER PUBLICATIONS

"Forming Conductive Vias Using a Light Guide", Application No. IB2018/054316, Filed Jun. 12, 2018.

* cited by examiner

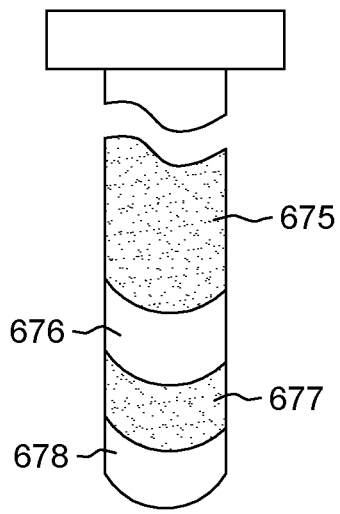
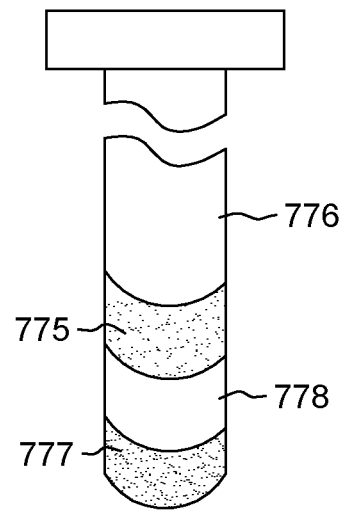
FIG. 6
FIG. 7
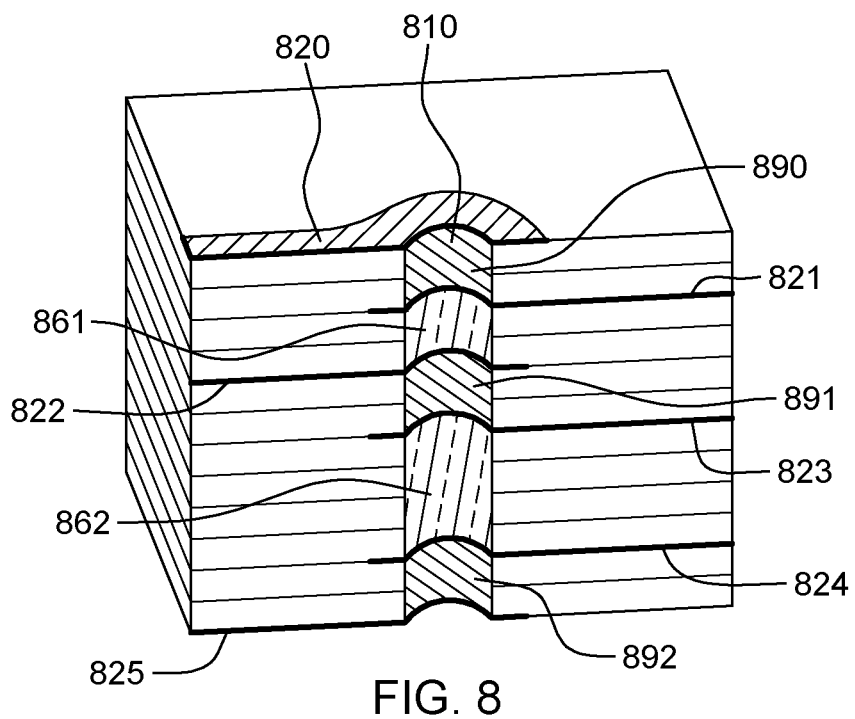
FIG. 8

FORMING CONDUCTIVE VIAS USING A LIGHT GUIDE

BACKGROUND

The present disclosure relates to conductive vias in printed circuit boards, and more specifically, to forming conductive vias using a light guide.

SUMMARY

The present invention provides a process and a structure of forming conductive vias using a light guide. In an exemplary embodiment, the process includes providing a via in a base material in a direction perpendicular to a plane of the base material, applying a photoresist layer to an interior surface of the via, inserting a light guide into the via, exposing, by the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

In an exemplary embodiment, the process includes providing a via in a base material, including at least two copper lines and at least one insulator layer separating the at least two copper lines, in a direction perpendicular to a plane of the base material, where the via intersects the at least two copper lines, applying a photoresist layer to an interior surface of the via, inserting a light guide into the via, where a portion of an outer surface of the light guide is masked, exposing, via the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

In an exemplary embodiment, the process includes providing a via in a base material, including at least two copper lines and at least one insulator layer separating the at least two copper lines, in a direction perpendicular to a plane of the base material, where the via intersects the at least two copper lines, applying a photoresist layer to an interior surface of the via, inserting a light guide into the via, exposing, via the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

In an exemplary embodiment, the structure includes a light source, a light guide, attached to the light source, where the light guide is capable of transmitting light from the light source, and a mask at a portion of a surface of the light guide, thereby resulting in an uncovered portion of the light guide and a covered portion of the light guide, where at least a portion of the light guide is designed such that it may be inserted into a via of a printed circuit board.

BRIEF DESCRIPTION OF THE DRAWINGS

FIG. 6 depicts a diagram in accordance with an exemplary embodiment of the present invention.

FIG. 7 depicts a diagram in accordance with an exemplary embodiment of the present invention.

FIG. 8 depicts a cutaway diagram in accordance with an exemplary embodiment of the present invention.

DETAILED DESCRIPTION

Figure 1:
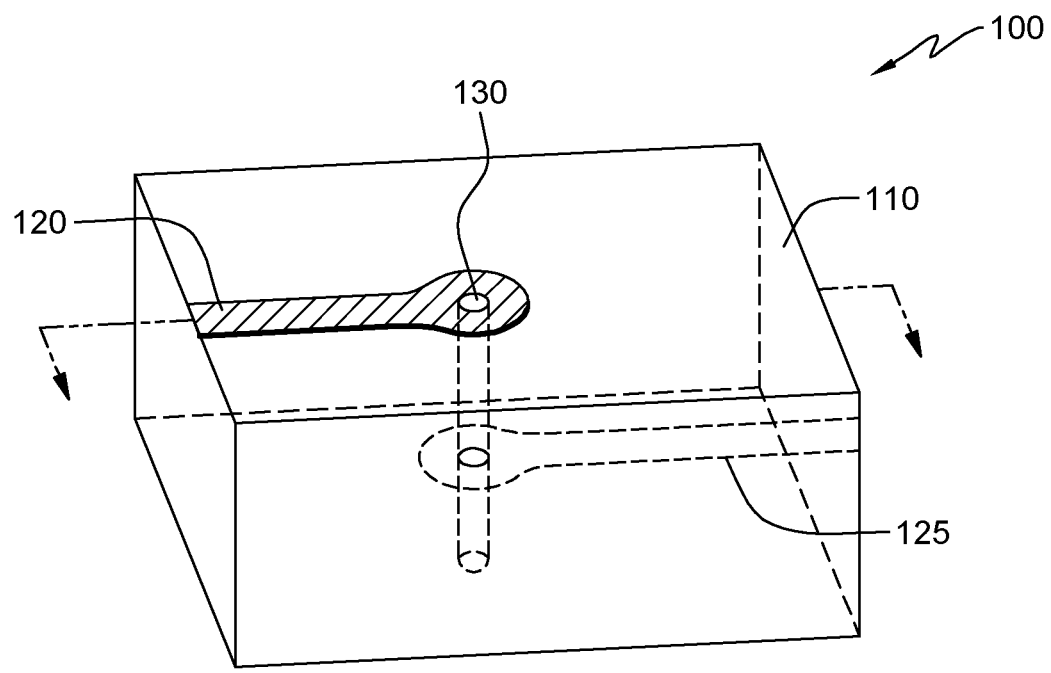
FIG. 1 depicts a diagram in accordance with an exemplary embodiment of the present invention.

The present invention provides a process and a structure. In an exemplary embodiment, the process includes providing a via in a base material in a direction perpendicular to a plane of the base material, applying a photoresist layer to an interior surface of the via, inserting a light guide into the via, exposing, by the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

In an exemplary embodiment, the process includes providing a via in a base material, including at least two copper lines and at least one insulator layer separating the at least two copper lines, in a direction perpendicular to a plane of the base material, where the via intersects the at least two copper lines, applying a photoresist layer to an interior surface of the via, inserting a light guide into the via, where a portion of an outer surface of the light guide is masked, exposing, via the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

In an exemplary embodiment, the process includes providing a via in a base material, including at least two copper lines and at least one insulator layer separating the at least two copper lines, in a direction perpendicular to a plane of the base material, where the via intersects the at least two copper lines, applying a photoresist layer to an interior surface of the via, inserting a light guide into the via, exposing, via the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal and a portion of the via not plated with metal.

In an exemplary embodiment, the structure includes a light source, a light guide, attached to the light source, where the light guide is capable of transmitting light from the light source, and a mask at a portion of a surface of the light guide, thereby resulting in an uncovered portion of the light guide and a covered portion of the light guide, where at least a portion of the light guide is designed such that it may be inserted into a via of a printed circuit board.

One of the major signal performance concerns of current and next generation multi-layer printed circuit boards (PCB) is degradation of electrical signals traveling through vias between layers due to stubs. A multi-layer PCB is a stack of PCB cards, with electrical components on each of the PCB cards. One method of connecting the layers of the PCB cards is by forming vias (or holes) through one or more of the PCB layers and coating or depositing metal on the inner surface of the via. A stub is the undesired portion of a coated via in a multi-layer beyond the desired portion of the coated via. In the design of large computer systems, PCB with a significant number of signal layers are possible. Metal coated vias are used in multi-layered printed circuit boards to electrically connect conductive lines or traces in differing layers of the printed circuit boards. Multiple metal coated vias may be required to form a connection of internal wiring between mounted circuit devices or connections to other interfaces such as I/O connectors.

During the manufacturing of the printed circuit board, the vias may be created by plating drilled vias in the board with a conductive material (e.g., copper). Typically, the entire depth of the via may be plated with the copper material. In this context, a stub refers to a portion of the via extending beyond the desired signal layer escape, and hence not part of the main-line signal path.

In order to reduce the impact of stubs on circuit board performance, the stubs may be removed from the board, or at least shortened, during the manufacturing process. One method for removing stubs is called back drilling. In this process, a drill bit, commonly one which has a slightly larger diameter than the bit used in predrilling the hole for the via (prior to plating), may be used by a drill for boring into the via and removing the plating material from its stub portion.

In an embodiment, a multilayer PCB is formed with a via (e.g., through hole) through two or more layers of the PCB. In an embodiment, the via is formed by drilling or punching a hole through the PCB after the multilayer PCB is stacked.

In an embodiment, the via is formed by aligning individual holes in in the PCB layers to form a single via. In an embodiment, the via runs through the full thickness of the PCB. For example, a via could be drilled through each of the layers after the PCB is formed. In an embodiment, the via runs through some of the layers but not all of the layers of the PCB. For example, vias could be punched through a portion of the layers of the PCB and those portions could be aligned during assembly of the multilayer PCB. In an embodiment, the PCB has multiple through holes or vias similar to the aforementioned vias.

In an embodiment, after formation of the via in the PCB, the via will be coated with a photoresist resin resulting in a photoresist layer on the inner surface of the via. In an embodiment, the photo resin is a positive photoresist. In a positive photoresist resin, the portion of the photoresist that is exposed to light becomes soluble to a photoresist developer while the unexposed portion of the photoresist resin remain insoluble to the photoresist developer.

In an embodiment, the photoresist resin is a negative photoresist resin. In a negative photoresist resin the portion of the photoresist that is exposed to light becomes insoluble to the photoresist developer while the unexposed portion of the photoresist is dissolved by the photoresist developer. In an embodiment, the photoresist is a photopolymeric photoresist. For example, the photoresist could be methyl methacrylate. In an embodiment, the photoresist is a photodecompostable photoresist. For example, the photoresist could be diazonaphtaquinone. In an embodiment, the photoresist is a photo crosslinking photoresist. In an embodiment, the photoresist is a self-assembled monolayer photoresist. In an embodiment, air is blown into the via after coating with the photoresist to prevent tenting. Tenting is a meniscus layer of the photoresist resin on the surface of the via.

In an embodiment, a light guide is inserted into the via. The light guide is capable of transmitting light from a light source and exposing a portion of the via with the light from the light source. In an embodiment, the light guide could be any optical cable or projecting member that is capable of transmitting light.

In an embodiment, a portion of an outer surface of the light guide is masked. In an embodiment, the mask is designed to prevent light from exiting the light guide in the portion of the light guide where the outer surface is covered by the mask. In an embodiment, the mask is designed to reflect or refract light back in towards the light guide in the portion of the light guide where the outer surface covered is by the mask. In an embodiment, the masked portion of the light guide has two or more masked regions separated by one or more unmasked regions. In an embodiment, the mask is a coating on the surface of the light guide. In an embodiment, the light guide would be masked by a surface treatment that is reflective of the wave length of light that is being used in the photo resistive process. For example, silver nitrate could be used. In an embodiment, the mask absorbs light. For example, an optical black coating could be used to absorb light.

In an embodiment, the light guide is tuned to optimize the light guides transmission of the light. For example, stress or strain can be induced in the light guide to change the optical properties of the light guide. In an embodiment, the mask is a treatment of the surface of the light guide. For example, the mask could be an etching of the surface of the light guide. The mask could also combine an etching with a coating. In an embodiment, the unmasked region is etched to affect light dissemination to the surface of the via. In an example, the light guide is a transparent core surrounded by a transparent cladding material with a lower index of refraction where the transparent cladding material with a lower index of refraction is the mask. In an embodiment, the transparent cladding only partially covers the surface of the light guide. In an embodiment, the light guide is not masked. In an embodiment, the end of the light guide is masked.

In an embodiment, the light guide is a fiber optic element. In an embodiment, the light guide has light dispersion characteristics such that light will come out of the sidewall of the light guide. In an embodiment, the light guide is designed such that light will come out of the end of the light guide. In the embodiment, the light guide is designed such that the light has a multi-mode dispersion at the sidewalls. In an embodiment, the end of the light guide is cleft or cut off, such that the light is dispersed towards the sidewalls of the via it is inserted into. For example, the light guide could be cut off straight or rounded with multiple cutes. The light guide could also have other modifications done to the end of the light guide to affect the way light is dispersed out of the light guide.

In an embodiment, the end of the light guide is designed according to the desired light transmission profile. For example, the end of the light guide could be cleft off straight, formed with a rounded end, or formed with a tapered side. In an embodiment, the end of the light guide has an optical coating. In an embodiment, any portion of the light guide that is not masked will have an optical coating. An optical coating is a coating that affects the way light is transmitted/dispersed out of or reflected/refracted back into the light guide.

In an embodiment, the light guide is connected to a light source (e.g., an LED, a lightbulb, the sun, etc.). The source can be any light source capable of introducing light (e.g., visible, ultraviolet, infrared, etc.) into the light guide for transmission to the intended surfaces. In an embodiment, the light guide is a light source.

In an embodiment, a photoresist layer is a positive tone photoresist material. In an embodiment, the removing includes removing the exposed portion of the photoresist layer. In an embodiment, the photoresist layer is a negative tone photoresist material. In an embodiment, the removing includes removing an unexposed portion of the photoresist layer. In an embodiment, the removing includes washing the via with a photoresist developer. In an embodiment, a photoresist developer is a liquid that dissolves uncured resin in a negative tone photoresist. In an embodiment, a photoresist developer is a liquid that dissolves cured resin in a positive tone photoresist. After washing the via will be left with a portion of the via having a bare surface and a portion of the via having a surface coated with photoresist.

In an embodiment, copper is deposited on the bare surface of the via. In an embodiment, a thin seed layer is deposited on the bare surface of the via followed by a thicker metal layer. In an embodiment, the metal deposited is any conductive metal (e.g., copper or gold).

Referring to FIG. 1, in an embodiment, a multilayer PCB 100 is formed with a via 130 a first line 120 on a first layer of base material 110 and a second line 125 on a second layer of base material 110. In one embodiment, base material 110 is an insulating material. For example, base material 110 could include oxide materials, silicon materials, or fiberglass materials. In an embodiment, in order to form a connection between first line 120 and second line 125 in via 130, without a stub extending significantly beyond the intended coverage, a light guide is used to selectively cure a photoresist on the inner surface of via 130.

Positive Tone Photoresist Process

Figure 2A:
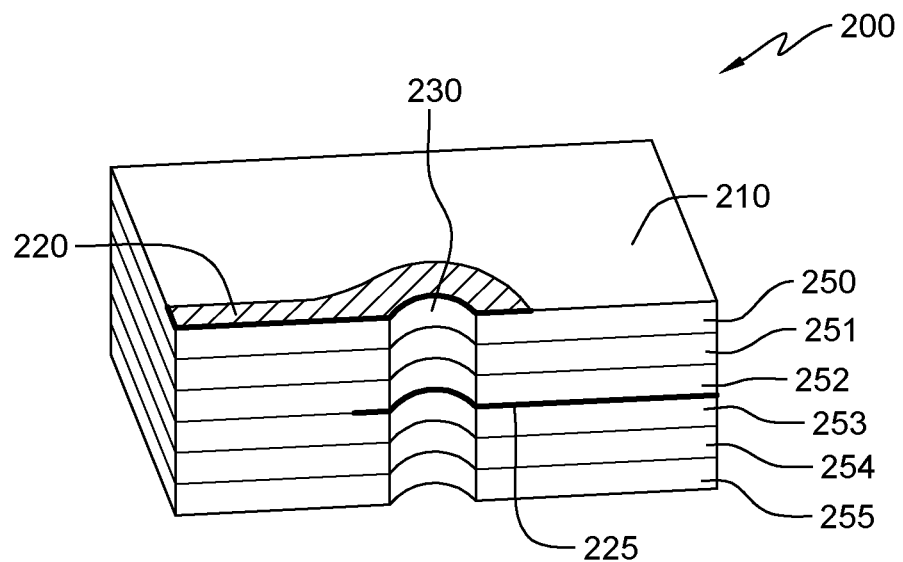
FIG. 2A depicts a cutaway diagram in accordance with an exemplary embodiment of the present invention.

Referring to FIG. 2A, in an embodiment, a process for producing a PCB package 200 includes providing a via 230 in a base material 210 in a direction perpendicular to a plane of base material 210, metal lines 220 on top of layer 250 and metal line 225 on top of layer 253. Layers 250, 251, and 252 separate metal lines 220 and 225.

Figure 2B:
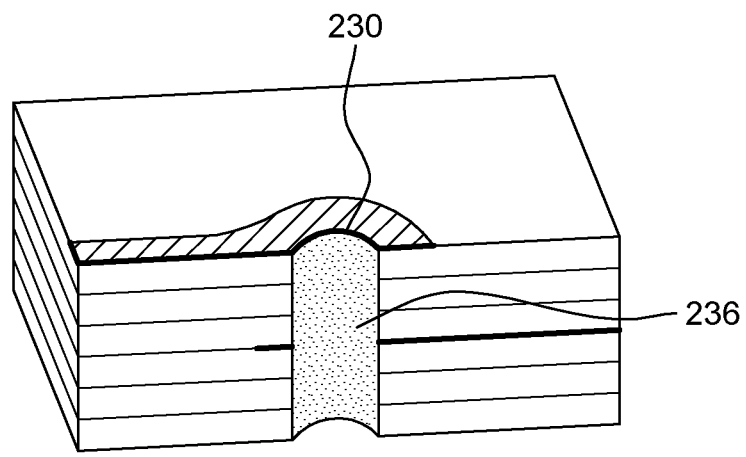
FIG. 2B depicts a cutaway diagram in accordance with an exemplary embodiment of the present invention.

Referring to FIG. 2B, a photoresist layer 236 is applied to an interior surface of via 230.

Figure 2C:
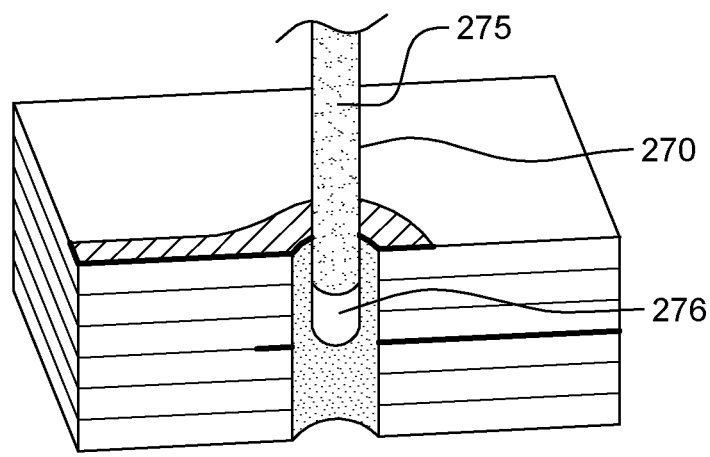
FIG. 2C depicts a cutaway diagram in accordance with an exemplary embodiment of the present invention.

Referring to FIG. 2C, the process further includes inserting a light guide 270 into via 230, and exposing, by light guide 270, a portion of the photoresist layer to light. In an embodiment, a portion of an outer surface of light guide 270 is masked, resulting in a masked portion 275 and an unmasked portion 276 of light guide 270.

Figure 2D:
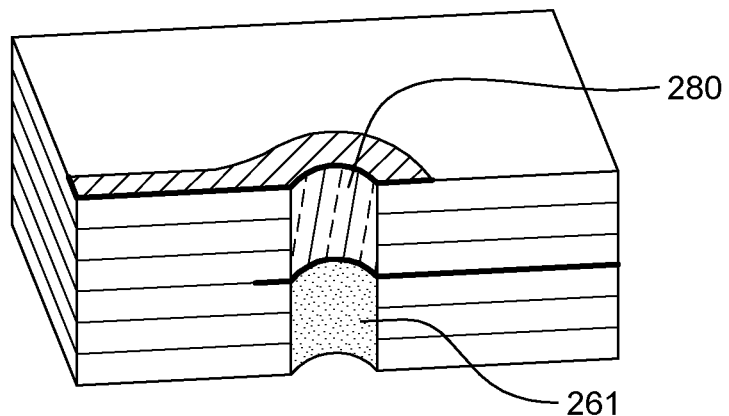
FIG. 2D depicts a cutaway diagram in accordance with an exemplary embodiment of the present invention.

Referring to FIG. 2D, exposing the portion of the photoresist layer to light, thereby results in an exposed portion 280 of the photoresist layer and an unexposed portion 261 of the photoresist layer. Unmasked portion 276 of light guide 270 is designed to expose only a portion of via 230 that is intended to be exposed, resulting in exposed portion 280. In and embodiment, the tip of light guide 270 is designed to focus light only to intended layers, thereby not curing additional layers. In an embodiment, unexposed portion 261 is left uncured so a washing does not remove the photoresist. In a positive tone photoresist, the developer used in washing removes the cured/exposed photoresist. Thus, metal will not be deposited on the surface of via 230 where photoresist remains.

Figure 2E:
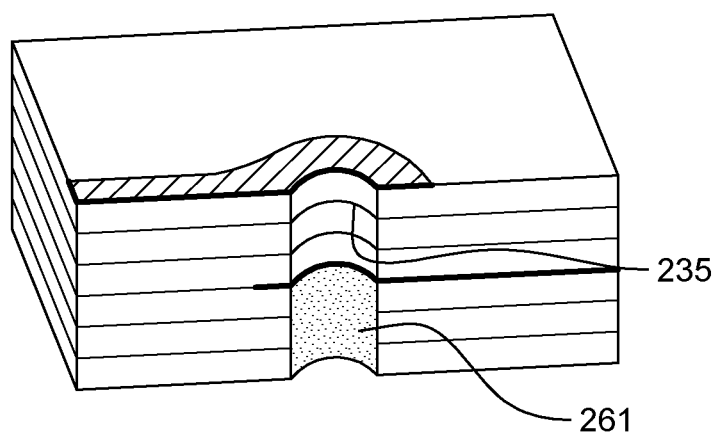
FIG. 2E depicts a cutaway diagram in accordance with an exemplary embodiment of the present invention.

Referring to FIG. 2E, in an embodiment using a positive tone photoresist material, a washing process removes exposed portion 280 of photoresist layer 236. In an embodiment, metal is deposited or plated an area 235 of via 230, where the photoresist has been removed.

Figure 2F:
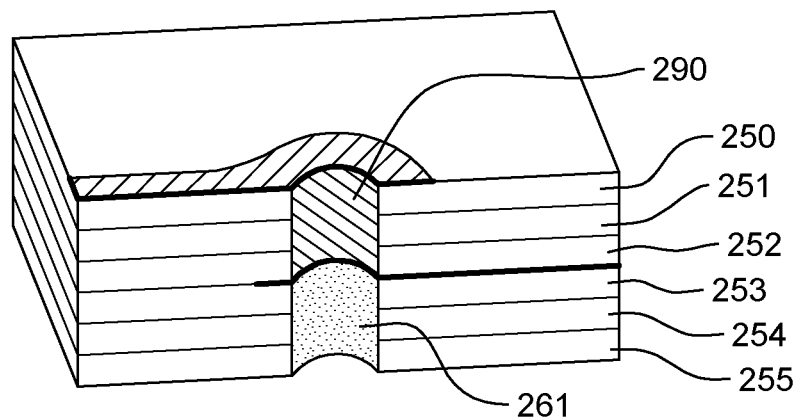
FIG. 2F depicts a cutaway diagram in accordance with an exemplary embodiment of the present invention.

Referring to FIG. 2F, in an embodiment, metal is deposited or plated an area 235 of via 230, where the photoresist has been removed, thereby resulting in a portion of via 230 with metalized region 290 and an unexposed portion 261 of via 230 without metal. In an embodiment, layers 250, 251, and 252 have metal deposited in the portion of via 230 running through layers 250, 251, and 252 forming metalized region 290 that connects metal line 220 to metal line 225. In an embodiment, in order to ensure metal line 220 connects to metal line 225, the portion of via 230 in layer 253 may be partially plated with metal extending from metalized region 290 partially down into layer 253. For example, the portion of via 230 in layer 253 could be partially exposed by light guide 270 such that, after washing and depositing, layer 253 has enough metal plating to ensure coverage of metal line 225, but not enough metal to contact a line between layers 253 and 254. In an embodiment, this process eliminates or reduces the formation of a stub in unexposed portion 261 of via 230.

Negative Tone Photoresist Process

Figure 3A:
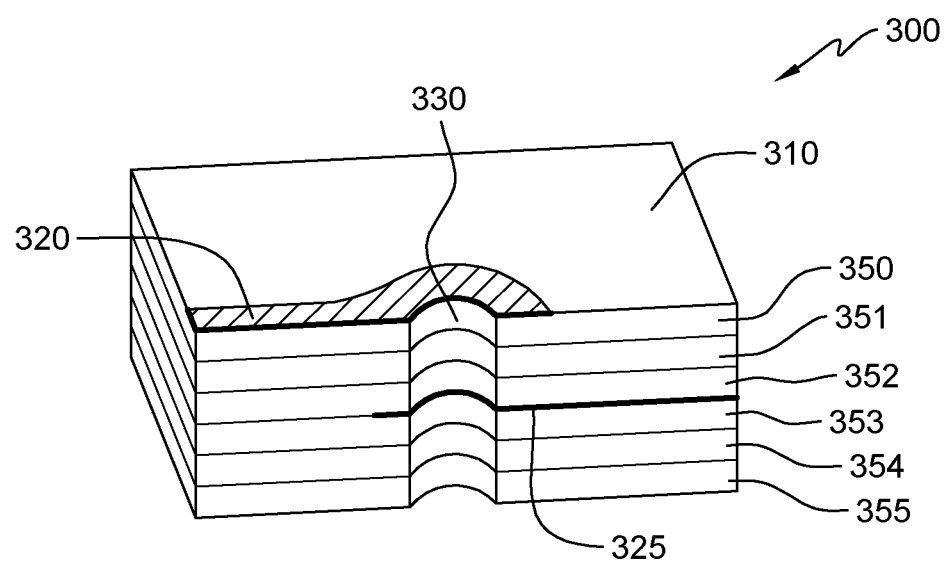
FIG. 3A depicts a cutaway diagram in accordance with an exemplary embodiment of the present invention.

Referring to FIG. 3A, in an embodiment, a process for producing a PCB package 300 includes providing a via 330 in a base material 310 in a direction perpendicular to a plane of base material 310, metal lines 320 on top of layer 350 and metal line 325 on top of layer 353. Layers 350, 351, and 352 separate metal lines 320 and 325.

Figure 3B:
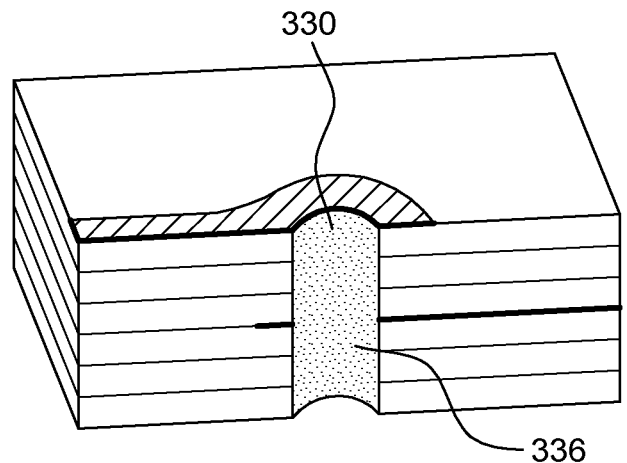
FIG. 3B depicts a cutaway diagram in accordance with an exemplary embodiment of the present invention.

Referring to FIG. 3B, a photoresist layer 336 is applied to an interior surface of via 330.

Figure 3C:
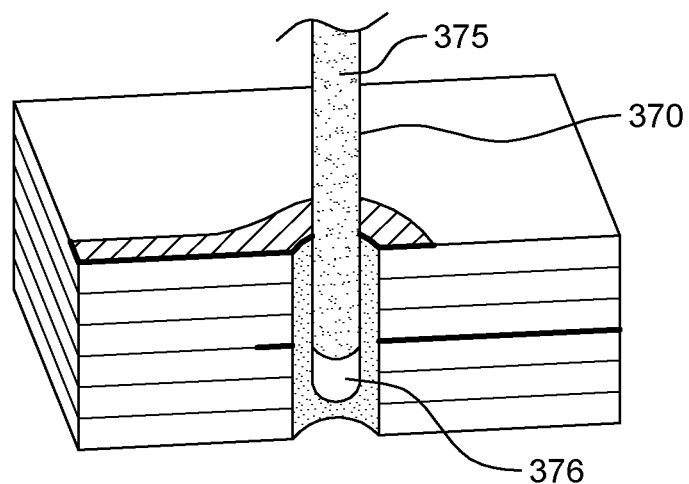
FIG. 3C depicts a cutaway diagram in accordance with an exemplary embodiment of the present invention.

Referring to FIG. 3C, the process further includes inserting a light guide 370 into via 330, and exposing, by light guide 370, a portion of the photoresist layer to light. In an embodiment, a portion of an outer surface of light guide 370 is masked, resulting in a masked portion 375 and an unmasked portion 376 of light guide 370.

Figure 3D:
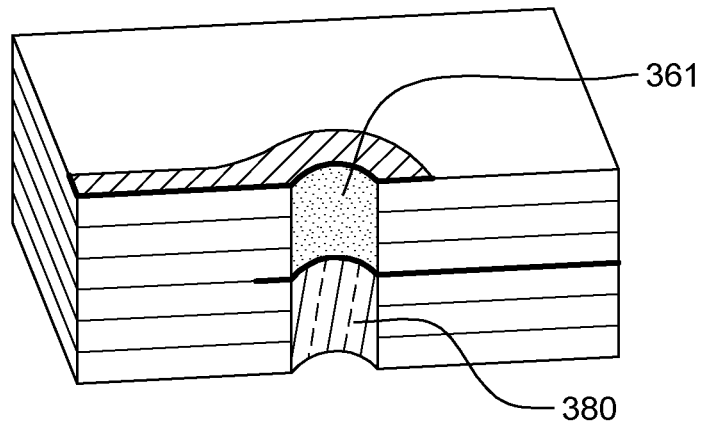
FIG. 3D depicts a cutaway diagram in accordance with an exemplary embodiment of the present invention.

Referring to FIG. 3D, in an embodiment, exposing, by light guide 370, a portion of the photoresist layer to light, thereby resulting in an exposed portion 380 of the photoresist layer and an unexposed portion 361 of the photoresist layer. Unmasked portion 376, of light guide 370, is designed to expose only exposed portion 380 of via 330 that is intended to be exposed. In and embodiment, the tip of light guide 370 is designed to focus light only to intended layers, thereby not curing additional layers.

Figure 3E:
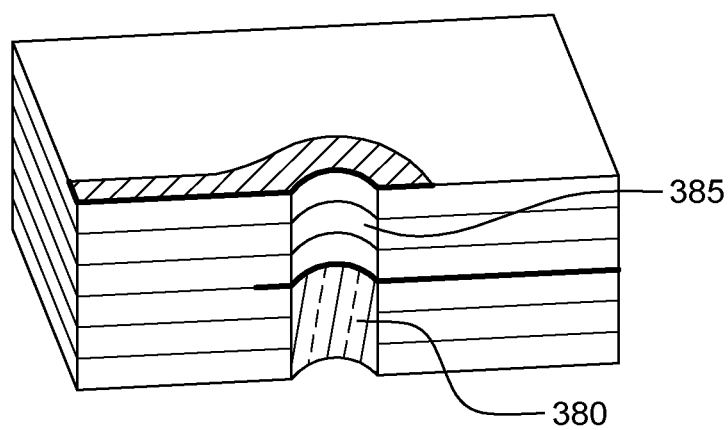
FIG. 3E depicts a cutaway diagram in accordance with an exemplary embodiment of the present invention.

Referring to FIG. 3E, in an embodiment using a negative tone photoresist material, a washing process removes unexposed portion 361 of the photoresist. In a negative tone photoresist process, washing the via with a photo developer will remove unexposed/uncured photoresist resin. In an embodiment, an exposed portion 380 is cured so a washing does not remove the photoresist. Thus, metal will not be deposited on the surface of via 330 where photoresist remains. In an embodiment, metal is deposited or plated an area 385 of via 330, where the photoresist has been removed, thereby resulting in a portion of via 330 with metalized region 390 and an exposed portion 380 of via 330 without metal.

Figure 3F:
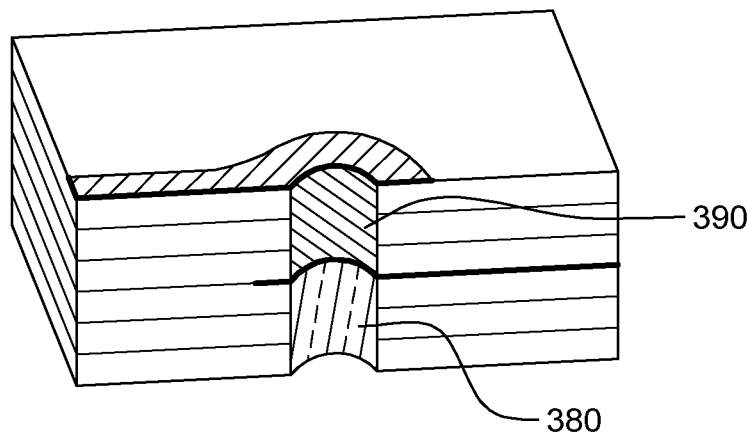
FIG. 3F depicts a cutaway diagram in accordance with an exemplary embodiment of the present invention.

Referring to FIG. 3F, in an embodiment, metal is deposited or plated an area 385 of via 330, where the photoresist has been removed, thereby resulting in a portion of via 330 with metalized region 390 and an exposed portion 380 of via 330 without metal. In an embodiment, layers 350, 351, and 352 have metal deposited in via 330 forming metalized region 390 that connects metal line 320 to metal line 325. In an embodiment, in order to ensure metal line 320 connects to metal line 325, layer 353 via may be partially plated with metal, extending metalized region 390 partially down into layer 353. For example, layer 353 could be only partially exposed by light guide 370 such that, after washing and depositing, layer 353 has enough metal playing to ensure coverage of metal line 325, but not enough metal to contact a line between layers 353 and 354. In an embodiment, this process eliminates or reduces the formation of a stub in exposed portion 380.

Light Guide

Figure 4:
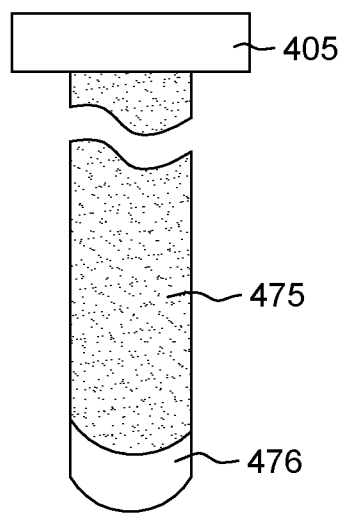
FIG. 4 depicts a diagram in accordance with an exemplary embodiment of the present invention.

Referring to FIG. 4, in an embodiment, a light guide is part of a structure including a light source 405, a light guide, attached to light source 405, where the light guide is capable of transmitting light from light source 405, and a mask region on a portion of the surface of the light guide, thereby resulting in an uncovered region 476 of the light guide and masked region 475 of the light guide, where the light guide is designed such that it may be inserted into a via in a printed circuit board.

In an embodiment, masked region 475 is the area running from light source 405 to an uncovered region 476. Thus, light will only be emitted from uncovered region 476. The line between masked region 475 and uncovered region 476 will correspond to the limit of light exposure on the via wall Likewise, the end of the light guide will only cure the surface of the via near the exposed end.

Figure 5:
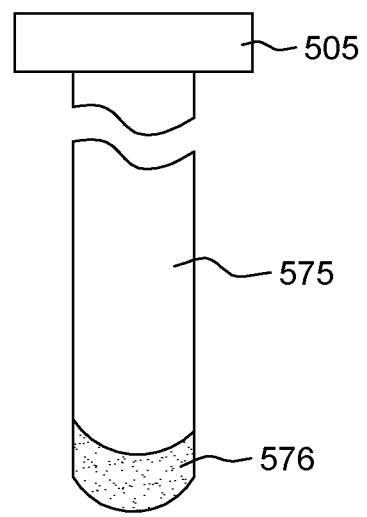
FIG. 5 depicts a diagram in accordance with an exemplary embodiment of the present invention.

Referring to FIG. 5, in an embodiment, a light guide is part of a structure including a light source 505, a light guide, attached to light source 505, where the light guide is capable of transmitting light from light source 505, and a mask region on a portion of the surface of the light guide, thereby resulting in an uncovered portion 575 of the light guide and masked region 576 of the light guide, where the light guide is designed such that it may be inserted into a via in a printed circuit board.

In an embodiment, uncovered region 575 will run to masked region 576. Light will be emitted from uncovered region 575, and light will not be emitted from masked region 576. The line between uncovered region 575 and masked region 576 will correspond to a region of the via between the cured region and the uncured region.

Referring to FIG. 6, in an embodiment, a light guide has multiple masked and exposed regions. Uncovered regions 676 and 678 would cure corresponding regions of the photoresist on the surface of a via (similar to exposed portion 280 and exposed portion 380), and masked regions 675 and 677 would prevent curing of areas of the via (similar to unexposed portion 261 and unexposed portion 361).

Referring to FIG. 7, in an embodiment, a light guide has multiple masked and exposed regions. Uncovered regions 776 and 778 would cure corresponding regions of the photoresist on the surface of a via, and masked regions 775 and 777 would prevent curing of areas of the via.

Figure 9:
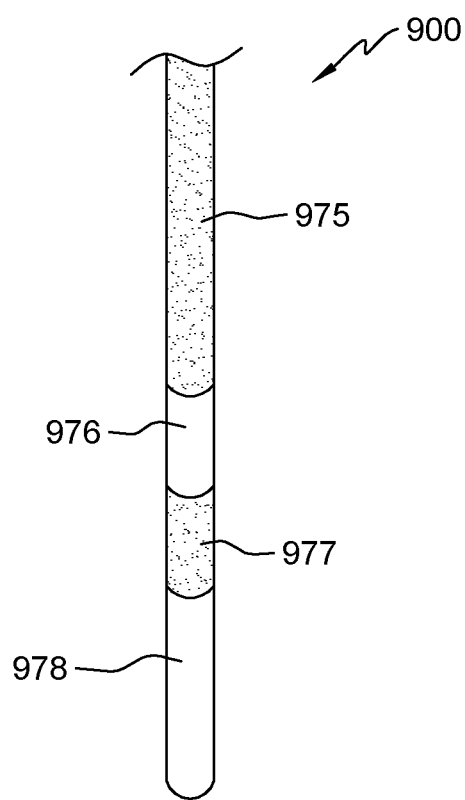
FIG. 9 depicts a diagram in accordance with an exemplary embodiment of the present invention.

Referring to FIG. 8 and FIG. 9, in an embodiment, a light guide is masked in several areas to form intermittent conductive regions in a via 830. For example, using a light guide, such as light guide 900, with multiple masked regions, multiple conductive regions of a via could be formed. An exposure from light guide 900 on via 830 on a negative tone photoresist would result in regions 861 and 862 being exposed and/or cured. Washing would subsequently remove unexposed/uncured photoresist resin from regions 890, 891, and 892. Metal deposition or plating of via 830 would result in regions 890, 891, and 892 being coated with metal, resulting in a conductive connection between metal lines 820 and 821, between metal lines 822 and 823, and between metal lines 824 and 825. In an embodiment, regions 861 and 862 are designed to be slightly smaller than depicted to ensure that the metal coating in regions 890, 891, and 892 cover metal lines 820, 821, 822, and 823. Exposed region 976 corresponds to region 861 of the remaining photoresist coating, and exposed region 978 corresponds to region 862 of the remaining photoresist resin.

Figure 10:
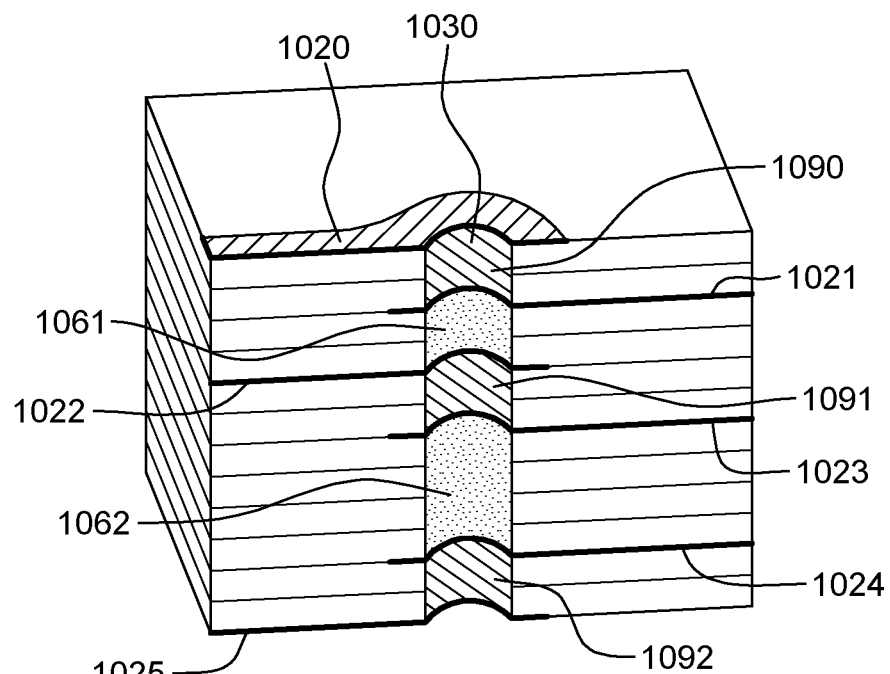
FIG. 10 depicts a cutaway diagram in accordance with an exemplary embodiment of the present invention.
Figure 11:
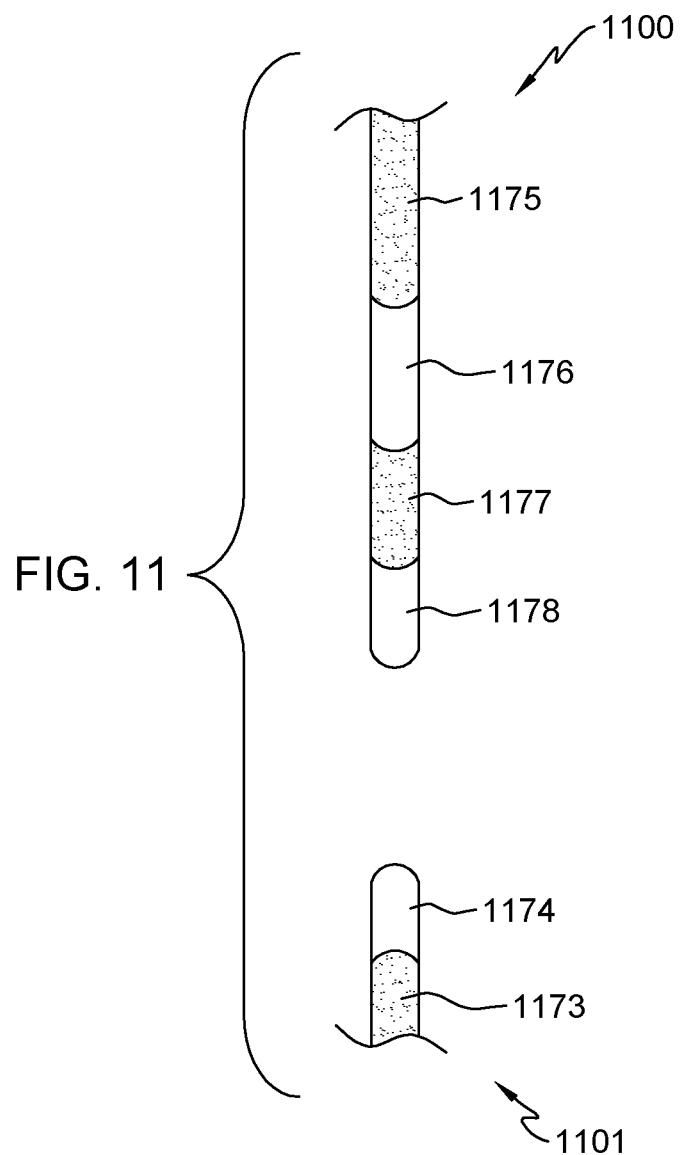
FIG. 11 depicts a diagram in accordance with an exemplary embodiment of the present invention.

Referring to FIG. 10 and FIG. 11, in an embodiment, two or more light guides with one or more exposed regions could be inserted from opposite ends of a via 1030 to expose photoresist resin on the surface of via 1030. For example, light guide 1100 could be inserted from the top of via 1030 and light guide 1101 could be inserted from the bottom of via 1030. Using a positive tone photoresist, exposed regions 1176 and 1178 would cure resin in via 1030 regions 1090 and 1091. Likewise, exposed region 1174 on light guide 1101 would expose region 1092 of via 1030. The cured positive tone photoresist in regions 1090, 1091, and 1092 could be washed away. Metal could then be formed on exposed surfaces in regions 1090, 1091, and 1092. In an embodiment, cured regions 1090, 1091, and 1092 could be over exposed, by reducing masked regions 1175, 1177, and 1173, to ensure that metal lines 1020, 1021, 1022, 1023, 1024, and 1025 are electrically connected to the respective conductive regions 1090, 1091, and 1092.

Figure 12:
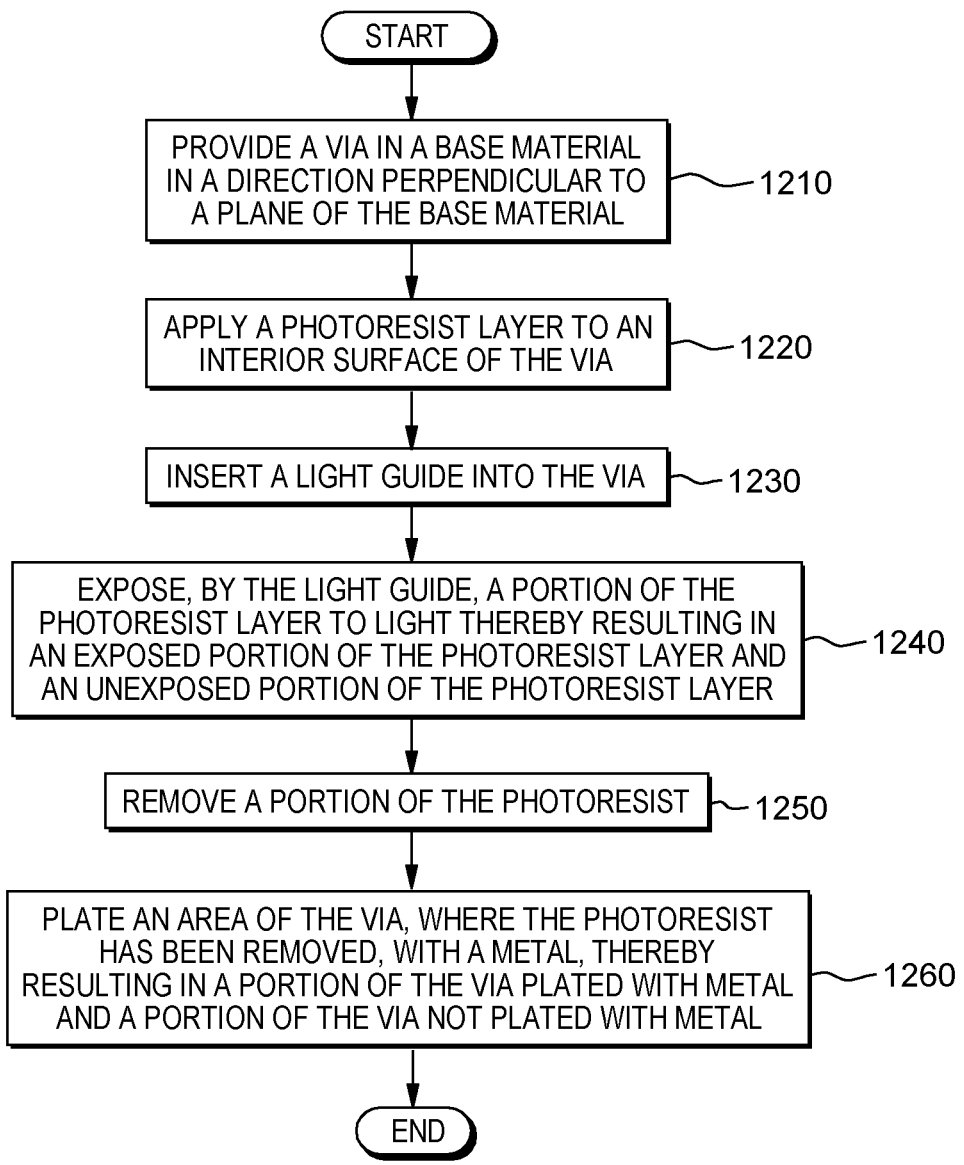
FIG. 12 depicts a flowchart in accordance with an exemplary embodiment of the present invention.

Referring to FIG. 12, in an exemplary embodiment, the present invention is configured to perform an operation 1210 of providing a via in a base material in a direction perpendicular to a plane of the base material, operation 1220 of applying a photoresist layer to an interior surface of the via, operation 1230 of inserting a light guide into the via, operation 1240 of exposing, by the light guide, a portion of the photoresist layer to light, thereby resulting in an exposed portion of the photoresist layer and an unexposed portion of the photoresist layer, an operation of 1250 of removing a portion of the photoresist layer, and an operation 1260 of plating an area of the via, where the photoresist has been removed, with a metal, thereby resulting in a portion of the via plated with metal and a portion of the via not plated with metal.

It will be understood that when an element is described as being "connected," "deposited on," or "coupled" to or with another element, it can be directly connected or coupled to the other element or, instead, one or more intervening elements may be present.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A process comprising:
   providing a via in a base material in a direction perpendicular to a plane of the base material;
   applying a photoresist layer to an interior surface of the via;
   inserting a light guide into the via;
   exposing, by the light guide, a portion of the photoresist layer to light, thereby resulting in an exposed portion of the photoresist layer and an unexposed portion of the photoresist layer;
   removing a portion of the photoresist layer; and
   plating an area of the via, where the photoresist has been removed, with a metal, thereby resulting in a portion of the via plated with metal and a portion of the via not plated with metal.

2. The process of claim 1, wherein a portion of an outer surface of the light guide is masked.

3. The process of claim 1, wherein the photoresist layer is a positive tone photoresist material.

4. The process of claim 3, wherein the removing comprises removing the exposed portion of the photoresist layer.

5. The process of claim 1 wherein the removing comprises washing the via with a photoresist developer.

6. The process of claim 1, wherein the photoresist layer is a negative tone photoresist material.

7. The process of claim 6, wherein the removing comprises removing the unexposed portion of the photoresist layer.

8. A process comprising:
   providing a via in a base material, comprising at least two copper lines and at least one insulator layer separating the at least two copper lines, in a direction perpendicular to a plane of the base material,
      wherein the via intersects the at least two copper lines;
   applying a photoresist layer to an interior surface of the via;
   inserting a light guide into the via,
      wherein a portion of an outer surface of the light guide is masked;
   exposing, via the light guide, a portion of the photoresist layer to light, thereby resulting in an exposed portion of the photoresist layer and an unexposed portion of the photoresist layer;
   removing a portion of the photoresist layer; and
   plating an area of the via, where the photoresist has been removed, with a metal, thereby resulting in a portion of the via plated with metal and a portion of the via not plated with metal.

9. The process of claim 8, wherein the masked portion of the light guide has two or more masked regions separated by one or more unmasked regions.

10. The process of claim 8, wherein the photoresist layer is a positive tone photoresist material.

11. The process of claim 10, wherein the removing comprises removing the exposed portion of the photoresist layer.

12. The process of claim 8 wherein the removing comprises washing the via with a photoresist developer.

13. The process of claim 8, wherein the photoresist layer is a negative tone photoresist material.

14. The process of claim 13, wherein the removing comprises removing the unexposed portion of the photoresist layer.

15. A process comprising:
   providing a via in a base material, comprising at least two copper lines and at least one insulator layer separating the at least two copper lines, in a direction perpendicular to a plane of the base material,
      wherein the via intersects the at least two copper lines;
   applying a photoresist layer to an interior surface of the via;
   inserting a light guide into the via;
   exposing, via the light guide, a portion of the photoresist layer to light, thereby resulting in an exposed portion of the photoresist layer and an unexposed portion of the photoresist layer;
   removing a portion of the photoresist layer; and
   plating an area of the via, where the photoresist has been removed, with a metal, thereby resulting in a portion of the via plated with metal and a portion of the via not plated with metal.

16. The process of claim 15, wherein a portion of an outer surface of the light guide is masked.

17. The process of claim 15, wherein the photoresist layer is a positive tone photoresist material.

18. The process of claim 17, wherein the removing comprises removing the exposed portion of the photoresist layer.

19. The process of claim 15 wherein the removing comprises washing the via with a photoresist developer.

20. The process of claim 15, wherein the photoresist layer is a negative tone photoresist material.

21. The process of claim 20, wherein the removing comprises removing the unexposed portion of the photoresist layer.

* * * * *